US011605442B2

(12) United States Patent
Du et al.

(10) Patent No.: US 11,605,442 B2
(45) Date of Patent: Mar. 14, 2023

(54) APPARATUSES AND METHODS FOR REFRESHING MEMORIES WITH REDUNDANCY

(71) Applicant: MICRON TECHNOLOGY, INC., Boise, ID (US)

(72) Inventors: Bin Du, Shanghai (CN); Liang Li, Shanghai (CN); Yu Zhang, Shanghai (CN); Yin Lu, Shanghai (CN)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 17/483,009

(22) Filed: Sep. 23, 2021

(65) Prior Publication Data

US 2022/0068429 A1 Mar. 3, 2022

Related U.S. Application Data

(63) Continuation of application No. 17/005,579, filed on Aug. 28, 2020, now Pat. No. 11,152,078.

(51) Int. Cl.

| G11C 29/44 | (2006.01) |
| G11C 29/02 | (2006.01) |
| G11C 29/00 | (2006.01) |
| G11C 29/12 | (2006.01) |
| G11C 29/10 | (2006.01) |

(52) U.S. Cl.
CPC .............. *G11C 29/44* (2013.01); *G11C 29/02* (2013.01); *G11C 29/10* (2013.01); *G11C 29/12015* (2013.01); *G11C 29/789* (2013.01); *G11C 2029/1202* (2013.01)

(58) Field of Classification Search
CPC ......... G11C 29/44; G11C 29/02; G11C 29/10; G11C 29/12015; G11C 29/789
See application file for complete search history.

(56) References Cited

U.S. PATENT DOCUMENTS

| 10,790,005 | B1 | 9/2020 | He et al. |
| 11,152,078 | B1 | 10/2021 | Du et al. |
| 2003/0043672 | A1 | 3/2003 | Inoue et al. |
| 2018/0158504 | A1 | 6/2018 | Akamatsu |
| 2019/0228814 | A1* | 7/2019 | Morohashi .......... G11C 11/4097 |
| 2019/0348100 | A1* | 11/2019 | Smith .................. G11C 29/804 |

OTHER PUBLICATIONS

U.S. Appl. No. 17/005,579 titled "Apparatuses and Methods for Refreshing Memories With Redundancy", filed Aug. 28, 2020, pp. all.

* cited by examiner

*Primary Examiner* — Han Yang
(74) *Attorney, Agent, or Firm* — Dorsey & Whitney LLP

(57) ABSTRACT

Embodiments of the disclosure are drawn to apparatuses methods for checking redundancy information for row addresses prior to performing various refresh operations, such as auto refresh and targeted refresh operations. In some examples, refresh operations may be multi pump refresh operations. In some examples, a targeted refresh operation may be performed prior to an auto refresh operation responsive to a multi pump refresh operation. In some examples, redundancy information for the auto refresh operation may be performed, at least in part, during the targeted refresh operation. In some examples, refresh operations on word lines may be skipped when the redundancy information indicates the word line is defective or unused.

20 Claims, 9 Drawing Sheets

APPARATUSES AND METHODS FOR REFRESHING MEMORIES WITH REDUNDANCY

CROSS REFERENCE TO RELATED APPLICATION(S)

This application is a continuation of U.S. patent application Ser. No. 17/005,579 filed Aug. 28, 2020 and issued as U.S. Pat. No. 11,152,078 on Oct. 19, 2021. The aforementioned application, and issued patent, is incorporated herein by reference, in its entirety, for any purpose.

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

One or more of the memory cells in a memory may be defective upon manufacturing or become defective over time. Some memories may include additional memory cells that may be used to replace the defective memory cells.

As memory components have decreased in size, the density of memory cells has greatly increased. Repeated access to a particular memory cell or group of memory cells (often referred to as a 'row hammer') may cause an increased rate of data degradation in nearby memory cells. It may be desirable to identify and refresh memory cells affected by the row hammer. However, in memories that include additional memory cells for replacing defective memory cells, memory cells nearby the hammered row may not be in use by the memory.

DETAILED DESCRIPTION

Figure 1:
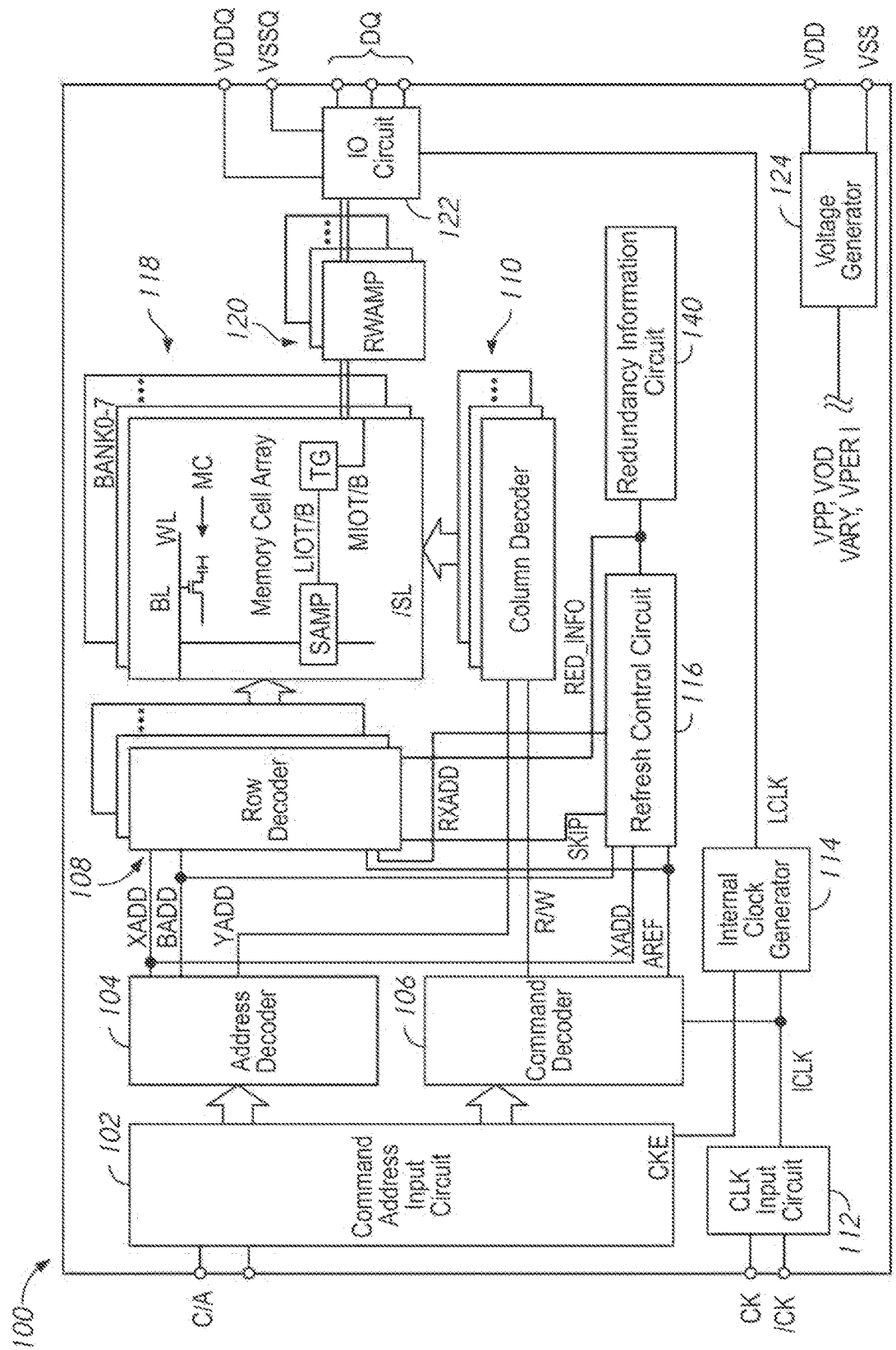
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a volatile memory device may be stored in memory cells (e.g., as a charge on a capacitive element), and may decay over time. The memory cells may be organized in one or more arrays including rows (word lines) and columns (bit lines), and the memory cells may be refreshed on a row-by-row basis. This row-by-row refreshing may be performed on a regular (e.g., periodic) basis in some memory devices. Repeated access to a particular row of memory (e.g., an aggressor row) may cause an increased rate of decay in neighboring rows (e.g., victim rows) due, for example, to electromagnetic coupling between the rows. In order to prevent information from being lost, it may be necessary to identify aggressor rows so that the corresponding victim rows can be refreshed to reduce information decay.

Row access operations may be monitored to determine which rows are aggressors or potential aggressors. For brevity, rows that are potential aggressors will also be referred to herein as aggressors or aggressor rows. In some applications, every access operation may be monitored to identify aggressor rows. For example, an aggressor row may be identified based on a number of accesses to a row within a given time period. In some applications, row hammer events may be identified by sampling accessed row addresses rather than monitoring every access. For example, a sample arming signal may be generated and each time the sample arming signal is activated, a current value of the row address on a row address bus may be sampled (e.g., latched). Aggressor row(s) may be identified based on one or more of the sampled row addresses. Using either technique, the identified aggressor rows may be used to calculate victim rows. Circuitry used to identify aggressor rows, victim rows, and cause victim rows to be refreshed may be referred to collectively as row hammer refresh circuitry. The victim rows may be refreshed to reduce information decay. In some applications, the victim rows may be refreshed outside the normal row-by-row refreshing operations of the memory device. These refresh operations for victim rows may be referred to as targeted refresh operations.

If one or more memory cells in a word line of the array becomes unusable (e.g., cannot provide or store data, conductive path associated with the memory cell has a short or break), the memory device may cease to use the defective word line. Some memory devices may include additional (e.g., extra) word lines in the array or in an additional array. These additional word lines may be referred to as "redundant" word lines (the word line originally assigned to the row address may be referred to as a "normal" word line). In typical use, the redundant word lines are not used by the memory device to store data. However, when a word line is found defective, a row address of the defective word line may be remapped to one of the redundant word lines. The redundant word line is then used by the memory device in place of the defective word line. Information on defective normal word lines and used redundant word lines may be stored as redundancy information in the memory device.

During refresh operations, both normal and redundant word lines may be refreshed. In some memory devices, every normal and redundant word line may be refreshed. Thus, even defective word lines (normal and redundant word lines may be defective) and unused redundant word lines may be refreshed. However, refreshing unused word lines may unnecessarily increase the power consumption of the memory device. Furthermore, in some memory devices, refreshing a defective word line may increase current draw and/or cause damage to adjacent and/or other nearby word lines. Checking the redundancy information prior to refresh operations may allow refreshing of defective and/or unused word lines to be skipped.

For some refresh operations, such as auto refresh operations described in more detail herein, a compressed refresh address is provided, which may correspond to multiple word lines in one or more banks of the memory (e.g., four word lines, eight word lines, sixteen word lines, etc.). These multiple word lines may be refreshed simultaneously or near simultaneously in some memory devices. However, in some memory devices, the redundancy information for the addresses of the individual word lines may not be checked in parallel. Accordingly, a significant amount of time may be required to check the redundancy information of the multiple word lines, which may require the refresh operation to be delayed. In some applications, delaying the refresh operation may compromise data stored in the memory cells and/or interfere with other memory operations.

According to embodiments of the present disclosure, a memory device may perform a multi pump refresh operation where multiple refresh operations are performed. For example, a refresh operation responsive to a pump may be a targeted refresh operation and a subsequent refresh operation responsive to a subsequent pump may be an auto refresh operation. Redundancy information associated with a row address for a refresh operation may be checked prior to performing the refresh operation on a word line associated with the row address. During at least a portion of the refresh operation, the redundancy information for a row address associated with a subsequent refresh operation may be checked prior to performing the subsequent refresh operation. If the redundancy information associated with the word lines indicate that the word lines are defective and/or unused, refresh operations on those word lines may be skipped.

In some applications, performing a targeted refresh operation prior to an auto refresh operation during a multi pump refresh operation may allow adequate time for checking the redundancy information for all row addresses such that delaying of refresh operations may be reduced or eliminated. In some applications, skipping refresh operations on defective word lines may reduce the risk of damage to nearby word lines and/or other components of the memory device. In some applications, skipping refresh operations on unused word lines may reduce power consumption by the memory device.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 218 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 108 and the selection of the bit lines BL and /BL is performed by a column decoder 110. In the embodiment of FIG. 1, the row decoder 108 includes a respective row decoder for each memory bank and the column decoder 110 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is output to outside from the data terminals DQ via the input/output circuit 122.

The device 100 may receive an access command which is a write command. When the write command is received, and a bank address, a row address and a column address are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The word lines WL of memory array 118 originally associated with the row addresses during design, manufacturing, and/or upon completion of manufacturing of the semiconductor device 100 may be referred to as "normal" word lines. In some embodiments, one or more of the banks BANK0-7 may include one or more additional word lines that may be used to replace defective word lines in the banks BANK0-7. These may be referred to as "redundant" word lines. In some embodiments, one or more of the banks BANK0-7 may only include redundant word lines. In some embodiments, the semiconductor device 100 may include an additional memory array 118 including redundant word lines. When a normal word line of memory array 118 is defective, the normal word line associated with the row address XADD may be remapped to one of the redundant word lines. Similarly, if a redundant word line used to replace a normal word line becomes defective, the redundant word line may be remapped to another redundant word line. When the word line associated with the row address XADD is remapped to the redundant word line, the remapping information (e.g., redundancy information) may be stored in a redundancy information circuit 140. In some embodiments, the redundancy information circuit 140 may include one or more latches for storing the redundancy information. In some embodiments, the latches may be fuse latches.

The redundancy information circuit 140 may compare the row address XADD to the information in the latches to see if a match for the row address XADD is stored in the latches. If a match for a normal word line is found in the redundancy information circuit 140, it indicates that the normal word line is defective and a redundant word line has been used to replace it. If no match is found for the normal word line in the redundancy information circuit 140, it indicates that the normal word line is in use (e.g., not defective). If a match for a redundant word line is found in the redundancy information circuit 140, it indicates that the redundant word line is being used to replace a defective normal word line. If no match is found for the redundant word line, it indicates that the redundant word line is defective and/or not in use. The redundancy information circuit 140 may return a redundancy information signal Red_Info that indicates whether or not a match for the row address XADD was found.

In some embodiments, during an access operation (e.g., read or write) the row decoder 108 may provide the row address XADD to the redundancy information circuit 140 to determine if word line associated with the row address has been remapped to a redundant word line. If the row address XADD matches a row address XADD in the redundancy information circuit 140, it indicates that word line of the row address XADD has been remapped, and the appropriate redundant word line may be accessed by the row decoder. If the row address XADD does not match a row address in the redundancy information circuit 140, it indicates that the word line of the row address XADD has not been remapped, and the original (e.g., normal) word line may be accessed by the row decoder 108.

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. In some embodiments, the refresh signal AREF may cause more than one refresh operation to be performed, which may be referred to as a "multi pump" refresh. The refresh signal AREF may be used to control the timing of refresh operations during the self-refresh mode. Thus, refresh operations may continue automatically. A self-refresh exit command may cause the automatic activation of the refresh signal AREF to stop.

The refresh signal AREF is supplied to the refresh control circuit 116. The refresh control circuit 116 supplies a refresh row address RXADD to the row decoder 108, which may refresh one or more word lines WL indicated by the refresh row address RXADD. In some embodiments, the refresh address RXADD may represent a single word line. In some embodiments, the refresh address RXADD may represent multiple word lines, which may be refreshed sequentially or simultaneously by the row decoder 108. In some embodiments, the number of word lines represented by the refresh address RXADD may vary from one refresh address to another. The refresh control circuit 116 may control a timing of the refresh operation, and may generate and provide the refresh address RXADD. The refresh control circuit 116 may be controlled to change details of the refreshing address RXADD (e.g., how the refresh address is calculated, the timing of the refresh addresses, the number of word lines represented by the address), or may operate based on internal logic.

The refresh control circuit 116 may selectively output a targeted refresh address (e.g., a victim address) or an automatic refresh address (auto refresh address) as the refresh address RXADD. The automatic refresh addresses may be from a sequence of addresses which are provided based on activations of the refresh signal AREF. The refresh control circuit 116 may cycle through the sequence of auto refresh addresses at a rate determined by the activations of the signal AREF. In some embodiments, the auto refresh operations may generally occur with a timing such that the sequence of auto refresh addresses is cycled such that no information is expected to degrade in the time between auto refresh operations for a given word line. In other words, auto refresh operations may be performed such that each word line is refreshed at a rate faster than the expected rate of information decay.

The refresh control circuit 116 may also determine targeted refresh addresses which are addresses that require refreshing (e.g., victim addresses corresponding to victim rows) based on the access pattern of nearby addresses (e.g., aggressor addresses corresponding to aggressor rows) in the memory array 118. The refresh control circuit 116 may use one or more signals of the device 100 to calculate the targeted refresh address RXADD. For example, the refresh address RXADD may be a calculated based on the row addresses XADD provided by the address decoder. The refresh control circuit 116 may sample the current value of the row address XADD provided by the address decoder 104 along a row address bus, and determine a targeted refresh address based on one or more of the sampled addresses.

While in general the present disclosure refers to determining aggressor and victim word lines and addresses, it should be understood that as used herein, an aggressor word line does not necessarily need to cause data degradation in neighboring word lines, and a victim word line does not necessarily need to be subject to such degradation. The refresh control circuit 116 may use some criteria to judge whether an address is an aggressor address, which may capture potential aggressor addresses rather than definitively determining which addresses are aggressors. For example, the refresh control circuit 116 may determine potential aggressor addresses based on a pattern of accesses to the addresses and this criteria may include some addresses which are not aggressors, and miss some addresses which are. Similar victim addresses may be determined based on which word lines are expected to be effected by aggressors, rather than a definitive determination of which word lines are undergoing an increased rate of data decay.

The refresh address RXADD may be provided with a timing based on a timing of the refresh signal AREF. The refresh control circuit 116 may have time slots corresponding to the timing of AREF, and may provide one or more refresh addresses RXADD during each time slot. in some embodiments, the targeted refresh address may be issued in (e.g., "steal") a time slot which would otherwise have been assigned to an auto refresh address. In some embodiments, certain time slots may be reserved for targeted refresh addresses, and the refresh control circuit 116 may determine whether to provide a targeted refresh address, not provide an address during that time slot, or provide an auto refresh address instead during the time slot.

The targeted refresh address may be based on characteristics over time of the row addresses XADD received from the address decoder 104. In some embodiments, the refresh control circuit 116 may sample the current row address XADD as it is provided on the row address bus to determine its characteristics over time. The sampling may be regular, random, and/or pseudo-random. In other embodiments, every received row address XADD may be monitored. The refresh control circuit 116 may use different methods to calculate a targeted refresh address based on the received row address XADD. For example, the refresh control circuit 116 may determine if a given row is an aggressor address, and then calculate and provide addresses corresponding to victim addresses of the aggressor address as the targeted refresh address. In some embodiments, more than one victim address may correspond to a given aggressor address. In this case the refresh control circuit may queue up multiple targeted refresh addresses, and provide them sequentially when it determines that a targeted refresh address should be provided. The refresh control circuit 116 may provide the targeted refresh address right away, or may queue up the targeted refresh address to be provided at a later time (e.g., in the next time slot available for a targeted refresh).

According to embodiments of the present disclosure, the refresh control circuit 116 may provide the auto refresh addresses and/or the targeted refresh addresses to the redundancy information circuit 140 and receive the redundancy information from the Red_Info signal to determine if the word line associated with the address is defective and/or an unused redundant word line. If a normal or redundant word line associated with the refresh address (e.g., targeted, auto) is determined to be defective and/or unused, the refresh control circuit 116 may cause a refresh operation of the word line to be skipped (e.g., not performed). If a normal or redundant word line associated with the refresh address is determined to be in use, the refresh control circuit 116 may cause the word line to be refreshed during a refresh operation.

In some embodiments, the refresh control circuit 116 may refrain from sending the particular auto refresh and/or targeted refresh address as RXADD to skip refreshing the word line. In some embodiments, the refresh control circuit 116 may provide a skip signal Skip to the row decoder 108 to indicate the particular word line associated with the RXADD address should not be refreshed. Alternatively, in some embodiments, all of the RXADD may be provided by the refresh control circuit 116 to the row decoder 108, and the row decoder 108 may check the redundancy information to determine which word lines should not be refreshed.

In some applications, an auto refresh address may correspond to multiple word lines (e.g., eight, sixteen) whereas a targeted refresh address may correspond to one word line. In other words, in some applications, the auto refresh address may be truncated or compressed. For example, if 3 bits are truncated from the auto-refresh address (e.g., it is an M-3 bit row address instead of an M bit row address) then the auto-refresh address may be associated with 8 word lines. Other levels and formats of compression/truncation may be used in other examples. In some applications, the redundancy information circuit 140 may provide redundancy information for one word line at a time. Thus, in these embodiments, it may take N clock cycles to receive the redundancy information for a targeted refresh operation, but N*X clock cycles to receive redundancy information for an auto refresh operation, where X is the number of word lines that correspond to the auto refresh address. In some applications, the number of clock cycles required to retrieve the redundancy information for all the word lines associated with the auto refresh address may cause the auto refresh operation to be delayed, which may not be desirable.

According to embodiments of the present disclosure, the semiconductor device 100 may perform multi pump refresh operations when an active AREF signal is provided. For example, for double pump refresh operations, two refresh operations may be performed, where each refresh operation is referred to as a 'pump'. In some embodiments, the redundancy information for a refresh address for a pump and a refresh address for a subsequent pump may be checked (e.g., retrieved) responsive to the pump. Some or all of the redundancy information for the refresh address for the subsequent pump may be checked during a refresh operation performed responsive to the pump. In some embodiments, the redundancy information for the subsequent pump may be available in time for a refresh operation performed responsive to the subsequent pump.

For example, in some embodiments, for at least some multi pump refresh operations, a targeted refresh operation may be performed for a pump and an auto refresh operation may be performed for a subsequent pump. For example, for at least some of the double pump refresh operations, a targeted refresh operation may be performed as a first pump and an auto refresh operation may be performed as a second pump. In some embodiments, the redundancy information for the targeted refresh address and the auto refresh addresses may be checked during the targeted refresh operation. In some embodiments, because the targeted refresh address may correspond to a single word line, the redundancy information may be checked within a time frame that permits the targeted refresh operation to be performed with little or no delay.

In some embodiments, because performing the targeted refresh operation does not further require the redundancy information circuit 140 or auto refresh address information, the redundancy information for the word lines associated with the auto refresh address may be checked after the targeted refresh address even if the targeted refresh operation is still being performed. The time to complete the targeted refresh operation may provide enough time to check the redundancy information for the word lines associated with the auto refresh address such that the redundancy information is available when required for the auto refresh operation performed.

When the redundancy information for determining whether the word lines associated with the targeted refresh address and/or auto refresh addresses is available for the appropriate refresh operation, refreshing of word lines associated with defective word lines and/or unused redundant word lines may be skipped as described herein. In some applications, skipping refresh operations of defective and/or unused word lines may reduce damage to the semiconductor device 100 and/or reduce power consumption.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 222. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
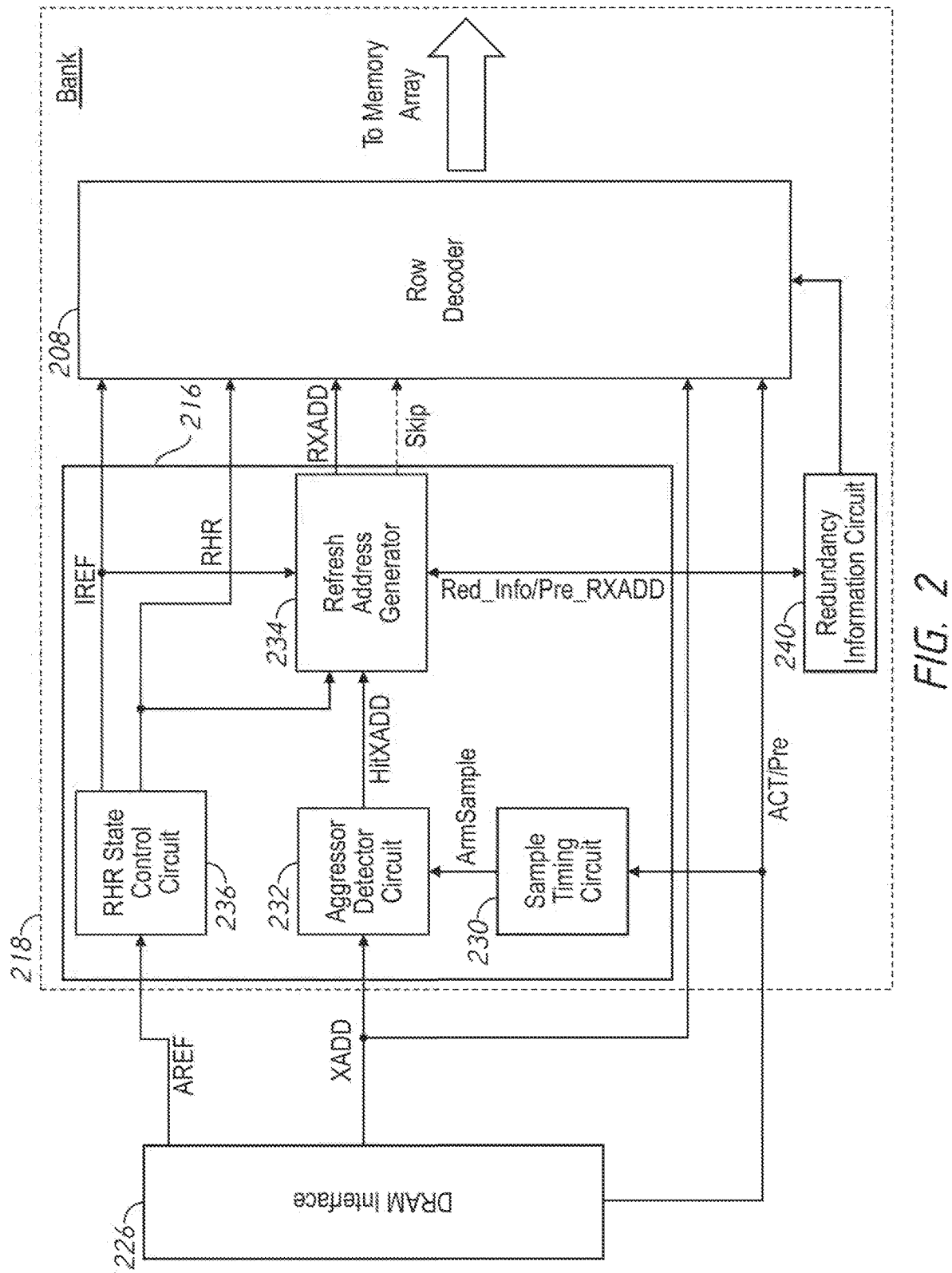
FIG. 2 is a block diagram of a refresh control circuit according to an embodiment of the present disclosure.

FIG. 2 is a block diagram of a refresh control circuit according to an embodiment of the present disclosure. The refresh control circuit 216 may, in some embodiments, be included in the refresh control circuit 116 of FIG. 1. Certain internal components and signals of the refresh control circuit 216 are shown to illustrate the operation of the refresh control circuit 216. The dotted line 218 is shown to represent that in certain embodiments, each of the components (e.g., the refresh control circuit 216 and row decoder 208) may correspond to a particular bank of memory, and that these components may be repeated for each of the banks of memory. Thus, there may be multiple refresh control circuits 216 and row decoders 208. For the sake of brevity, only components for a single bank will be described.

A DRAM interface 226 may provide one or more signals to an address refresh control circuit 216 and row decoder 208. The refresh control circuit 216 may include a sample timing circuit 230, an aggressor detector circuit 232, a row hammer refresh (RHR) state control circuit 236 and a refresh address generator 234. The DRAM interface 226 may provide one or more control signals, such as a refresh signal AREF, and a row address XADD. The refresh control circuit 216 provides refresh address RXADD with timing based on the refresh signal AREF, wherein some of the refresh addresses are based on the received row address XADD.

The aggressor detector circuit 232 may sample the current row address XADD responsive to an activation a sampling signal ArmSample. In some embodiments, the sampled addresses may be stored in the aggressor circuit 232 and/or compared to previously stored addresses. The aggressor detector circuit 232 may a match address HitXADD based on a currently sampled row address XADD and/or previously sampled row addresses. The RHR state control circuit 236 may provide the signal RHR to indicate that a row hammer refresh (e.g., a refresh of the victim rows corresponding to an identified aggressor row) should occur. The RHR state control circuit 236 may also provide an internal refresh signal IREF, to indicate that an auto refresh should occur. Responsive to an activation of RHR or IREF, the refresh address generator 234 may provide a refresh address RXADD, which may be an auto refresh address or may be one or more victim addresses corresponding to victim rows of the aggressor row corresponding to the match address HitXADD. The row decoder 208 may perform a refresh operation responsive to the refresh address RXADD and the row hammer refresh signal RHR. The row decoder 208 may perform an auto refresh operation based on the refresh address RXADD and the internal refresh signal IREF. In some embodiments, the row decoder 208 may be included in row decoder 108.

The DRAM interface 226 may represent one or more components which provides signals to components of the bank. In some embodiments, the DRAM interface 226 may represent a memory controller coupled to the semiconductor memory device (e.g., device 100 of FIG. 1). In some embodiments, the DRAM interface 226 may represent components such as the command address input circuit 102, the address decoder 104, and/or the command decoder 106 of FIG. 1. The DRAM interface 226 may provide a row address XADD, the refresh signal AREF, and access signals such as an activation signal ACT and a pre-charge signal Pre. The refresh signal AREF may be a periodic signal which may indicate when an auto refresh operation is to occur. The access signals ACT and Pre may generally be provided as part of an access operation along with a row address XADD. The activation signal ACT may be provided to activate a given bank of the memory. The pre-charge signal Pre may be provided to pre-charge the given bank of the memory. The row address XADD may be a signal including multiple bits (which may be transmitted in series or in parallel) and may correspond to a specific row of an activated memory bank.

In embodiments where row accesses are monitored by sampling (in contrast to monitoring every access operation) the sample timing circuit 230 provides the sample arming signal ArmSample. The signal ArmSample may be a binary signal which can be at a high logical level (which may be represented by a first voltage, such as VDD) or at a low logical level (which may be represented by a second voltage, such as ground or VSS). An activation of ArmSample may be a 'pulse', where ArmSample is raised to a high logic level and then returns to a low logic level. In some embodiments, the sample timing circuit 230 may use one or more mechanisms to regularly (e.g., non-random), randomly, semi-randomly, or pseudo-randomly determine whether to provide an activation of the signal ArmSample.

In some embodiments, the sample timing circuit 230 may receive the access signals ACT and Pre. In some embodiments, activations of the signal ArmSample may further be based on the signals ACT and Pre to ensure that each activation of the signal ArmSample is associated with an access operation.

The aggressor detector circuit 232 may receive the row address XADD from the

DRAM interface 226 and the signal ArmSample from the sample timing circuit 230. The row address XADD on the row address bus may change as the DRAM interface 226 directs access operations (e.g., read and write operations) to different rows of the memory cell array (e.g., memory cell array 118 of FIG. 1). Each time the aggressor detector circuit 232 receives an activation (e.g., a pulse) of the signal ArmSample, the aggressor detector circuit 232 may sample the current value of XADD. In some embodiments, the aggressor detector circuit 232 may provide the currently sampled value of XADD as the match address HitXADD. The refresh address generator 234 may provide one or more victim addresses associated with the match address HitXADD as the refresh address RXADD.

In some embodiments, responsive to an activation of the signal ArmSample, the aggressor detector circuit 232 may determine if one or more rows is an aggressor row based on the sampled row address XADD, and may provide identified aggressor rows as the match address HitXADD. As part of this determination, the aggressor detector circuit 232 may record (e.g., by latching in a register and/or otherwise storing) the current value of XADD responsive to the activation of ArmSample. The current value of XADD may be compared to previously recorded addresses in the aggressor detector circuit 232 (e.g., the addresses stored in the latch/register), to determine access patterns over time of the sampled addresses. If the aggressor detector circuit 232 determines that an address (which, in some embodiments, may be either the current address or a previously stored address) is an aggressor address, then the identified aggressor may be provided as a match address HitXADD. In some embodiments, the match address HitXADD may be provided responsive to the signal ArmSample. In some embodiments, the match address (e.g., aggressor address) HitXADD may be stored in a latch circuit for later retrieval by the refresh address generator 234 when the refresh address generator 234 determines a match address is needed.

In one example embodiment, in order to determine if the current address XADD is an aggressor address, the sampled value of the current row address XADD may be stored (e.g., latched in a latch circuit). The activation of ArmSample may also cause the aggressor detector circuit 232 to compare the currently sampled row address XADD to the previously stored addresses in the aggressor detector circuit 232. If the current row address XADD matches a stored address, the current row address XADD may be provided as the match address HitXADD.

In another example embodiment, the aggressor detector circuit 232 may store the value of sampled addresses in a register, and may have a counter associated with each of the stored addresses. When ArmSample is activated, if the current row address XADD matches one of the stored addresses, the value of the counter may be incremented. Responsive to the activation of ArmSample, the aggressor detector circuit 232 may provide the address associated with the highest value counter as the match address HitXADD. Other methods of identifying aggressor addresses may be used in other examples.

In embodiments where every row access command is monitored, the sample timing circuit 230 may be omitted. In these embodiments, the aggressor detector circuit 232 may perform the functions above responsive to the ACT/Pre signal rather than the ArmSample signal.

The RHR state control circuit 236 may receive the refresh signal AREF and provide the row hammer refresh signal RHR. The refresh signal AREF may be periodically generated and may be used to control the timing of refresh operations. The memory device may carry out a sequence of auto refresh operations in order to periodically refresh the rows of the memory device. The RHR signal may be generated in order to indicate that the device should refresh a particular targeted row (e.g., a victim row) instead of an address from the sequence of auto refresh addresses. The RHR state control circuit 236 may use internal logic to provide the RHR signal. In some embodiments, the RHR state control circuit 236 may provide the RHR signal based on certain number of activations of AREF (e.g., every $4^{th}$ activation of AREF, every $1^{st}$ or $2^{nd}$ pump of a double pump refresh operation). The RHR state control circuit 236 may also provide an internal refresh signal 1REF, which may indicate that an auto refresh operation should take place. In some embodiments, the signals RHR and IREF may be generated such that they are not active at the same time (e.g., are not both at a high logic level at the same time).

In some embodiments, the refresh control circuit 216 may perform multiple refresh operations responsive to an activation of the refresh signal AREF. For example, each time the refresh signal AREF is received, the refresh control circuit 216 may perform M different refresh operations, by providing M different refresh addresses RXADD. Each refresh operation may be referred to as a 'pump'. In some embodiments, the refresh control circuit 216 may have a fixed pattern where some pumps are assigned to auto refresh operation and some pumps are assigned to targeted refresh operations. For example, in some embodiments, for a double pump refresh operations, the RHR state control circuit 236 may activate the row hammer refresh signal RHR for a first pump and activate the internal refresh signal IREF for the second pump. Thus, in some embodiments, RHR and/or IREF may be referred to as pump signals for a multi pump refresh operation. In some embodiments, the refresh control circuit 216 may dynamically determine whether a given pump is associated with an auto refresh operation, a targeted refresh operation, or no refresh operation.

The refresh address generator 234 may receive the row hammer refresh signal RHR, the internal refresh signal IREF, and the match address HitXADD. The match address HitXADD may represent an aggressor row. The refresh address generator 234 may determine the locations of one or more victim rows based on the match address HitXADD and provide them as the refresh address RXADD when the signal RHR indicates a targeted refresh operation. In some embodiments, the victim rows may include rows which are physically adjacent to the aggressor row (e.g., HitXADD+1 and HitXADD-1). In some embodiments, the victim rows may also include rows which are physically adjacent to the physically adjacent rows of the aggressor row (e.g., HitXADD+2 and HitXADD-2). Alternative or additional relationships between victim rows and the identified aggressor rows may be used in other examples. For example, +/-3, +/-4, and/or other rows may also or may alternatively be refreshed.

The refresh address generator 234 may determine the value of the refresh address RXADD based on the row hammer refresh signal RHR. In some embodiments, when the internal refresh signal IREF is active, the refresh address generator 234 may provide one of a sequence of auto refresh addresses. When the signal RHR is active, the refresh address generator 234 may provide a targeted refresh address, such as a victim address, as the refresh address RXADD. In some embodiments, the refresh address generator 234 may count activations of the signal RHR, and may provide closer victim rows (e.g., HitXADD+/-1) more frequently than victim rows which are further away from the aggressor address (e.g., HitXADD+/-2).

The row decoder 208 may perform one or more operations on the memory array (not shown) based on the received signals and addresses. For example, responsive to the activation signal ACT and the row address XADD (and IREF and RHR being at a low logic level), the row decoder 208 may direct one or more access operations (for example, a read operation) on the specified row address XADD. Responsive to the RHR signal being active, the row decoder 208 may refresh the refresh address RXADD. However, as discussed below, in some embodiments, the row decoder 208 may skip refreshing the refresh address RXADD responsive to an active refresh Skip signal provided by the refresh address generator 234.

In some embodiments, the refresh address generator 234 may access redundancy information stored in a redundancy information circuit 240 prior to providing the refresh address RXADD to the row decoder 208. The refresh address generator 234 may provide the auto refresh addresses and targeted refresh addresses Pre_RXADD to the redundancy information circuit 240. The redundancy information circuit 240 may compare Pre_RXADD to the redundancy information to determine if Pre_RXADD matches a row address stored in the redundancy information circuit 240 and return the redundancy information (e.g., whether or not a match was found) to the refresh address generator 234.

For row addresses corresponding to normal word lines, if a match is found by the redundancy information circuit 240, it means the normal word line is defective and should not be refreshed. In some embodiments, the refresh address generator 234 may not provide the row address as RXADD to skip refreshing the defective row. Alternatively or additionally, the refresh address generator 234 may provide an active Skip signal when the redundancy information indicates refreshing of the word line should be skipped, regardless of whether the refresh address generator 234 provides RXADD. If no match is found by the redundancy information circuit 240, it means the normal word line is in use and should be refreshed. The refresh address generator 234 may provide the corresponding row address as RXADD to refresh the word line and/or provide an inactive Skip signal.

For row addresses corresponding to redundant word lines (e.g., redundant row address), if a match for the redundant row address is found, it means the redundant word line is being used as a repair for a normal word line and should be refreshed. The refresh address generator 234 may provide the corresponding row address as RXADD to refresh the redundant word line and/or provide an inactive Skip signal. If not match for the redundant row address is found, it means the redundant word line is not being used and/or is defective and should not be refreshed. The refresh address generator 234 may not provide the redundant row address as RXADD to skip refreshing the redundant word line and/or provide an active Skip signal.

Although multi pump refresh operations are not limited to such, for exemplary purposes, the disclosure will describe examples including double pump refresh operations. Furthermore, the disclosure will describe examples including targeted and auto refresh operations although the principles of the present disclosure are not limited to these particular types of refresh operations or combination of refresh operations. For example, an auto refresh operation of a single word line may be performed prior to an auto refresh operation for multiple word lines, and the redundancy information for both auto refresh operations may be performed during the first auto refresh operation.

As described in further detail herein, during a double pump refresh operation, the refresh address generator 234 may check the redundancy information for a targeted refresh address followed by serially checking the redundancy information for one or more auto refresh addresses. Once the redundancy information for the targeted refresh address is provided, the refresh address generator 234 may provide the appropriate RXADD for the targeted refresh operation. Providing the appropriate RXADD may include not providing an RXADD and/or providing an active Skip signal, which may cause refreshing of the victim word line to be skipped (e.g., when the victim word line corresponds to an unused or defective word line). During at least a portion of the targeted refresh operation, the refresh address generator 234 may continue to check the redundancy information for the auto refresh addresses. Once the redundancy information of the auto refresh addresses has been checked, the refresh address generator 234 may provide the appropriate RXADD for the auto refresh addresses, which may include, in some cases, not providing one or more of the auto refresh addresses and/or providing an active Skip signal, which may cause refreshing of the associated word lines to be skipped (e.g., when a word line corresponds to an unused or defective word line).

Alternatively, in some embodiments, the checking of the redundancy information may be performed on the refresh addresses RXADD by the row decoder circuit 208 rather than the refresh address generator 234. In these embodiments, all targeted and auto refresh addresses may be provided by the refresh address generator to the row decoder circuit 208.

Figure 3:
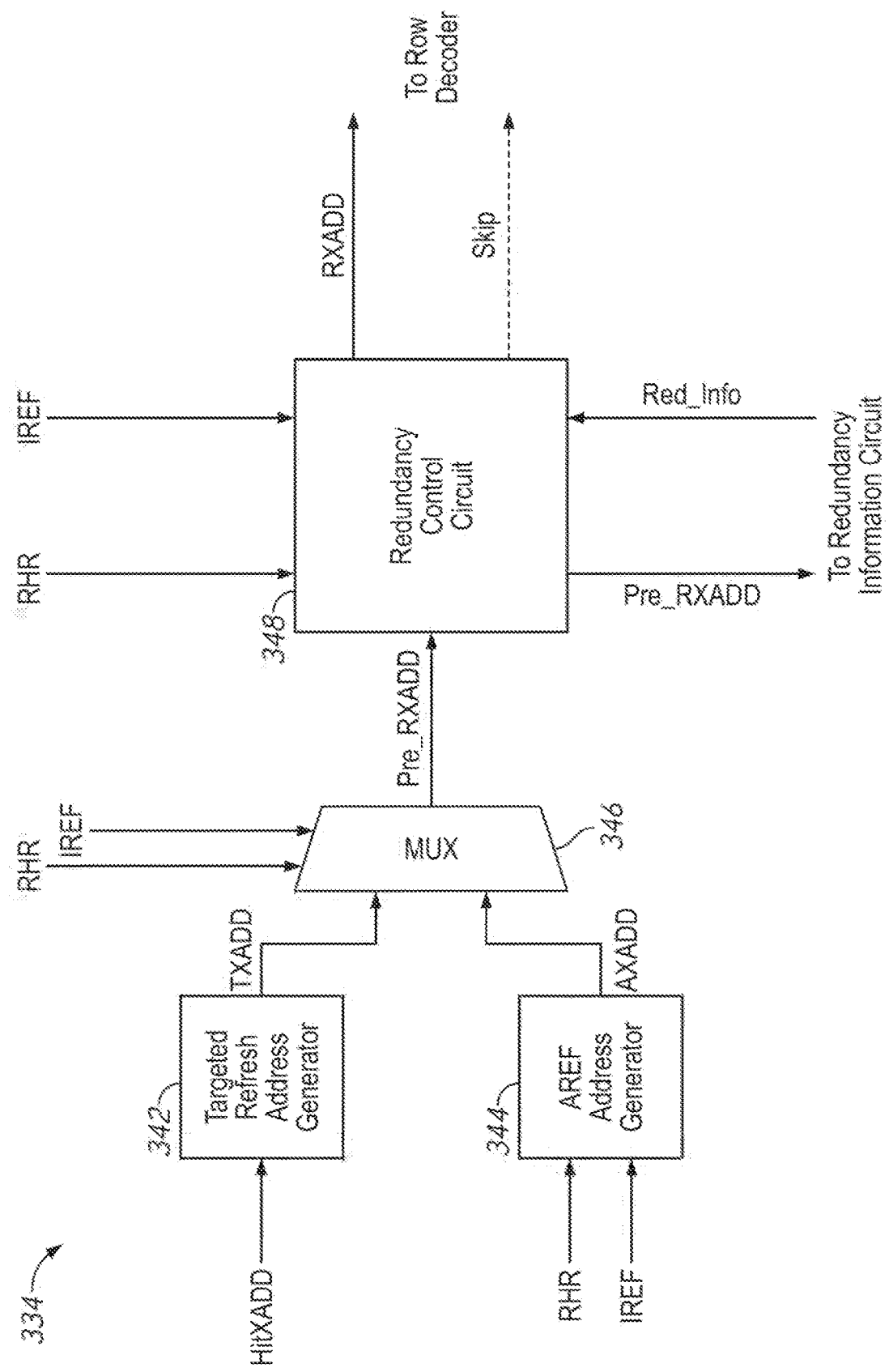
FIG. 3 is a block diagram of a refresh address generator according to an embodiment of the present disclosure.

FIG. 3 is a block diagram of a refresh address generator according to an embodiment of the present disclosure. In some embodiments, the refresh address generator 334 may be used to implement the refresh address generator 234. The refresh address generator 334 may include a targeted refresh address generator 342, an auto refresh (AREF) address generator) 344, a multiplexer (MUX) 346, and a redundancy control circuit 348.

The targeted refresh address generator 342 receives the matched address HitXADD which may correspond to an aggressor row address. The matched address may be received from an aggressor detector circuit such as aggressor detector circuit 232. Based at least in part on the matched address HitXADD, the targeted refresh address generator 342 may calculate one or more targeted refresh addresses TXADD, which may correspond to victim word lines of the aggressor word line associated with the matched address HitXADD.

The AREF address generator 344 generates an auto refresh address AXADD in response to the internal refresh signal IREF, which may be provided by a RHR state control circuit, such as RHR state control circuit 236. The auto refresh address AXADD may be part of a sequence of addresses to be refreshed as part of an auto refresh operation. The auto refresh address AXADD may correspond to multiple word lines in some embodiments. The refresh address generator 344 may update the current auto refresh address AXADD to a next address in the sequence in response to the active IREF signal. The AREF address generator 344 is also provided the row hammer refresh signal RHR from the state control circuit. When the RHR signal is active, the AREF address generator 344 may stop updating the auto refresh address AXADD. As described herein, since the active RHR signal indicates that a targeted refresh operation is to be conducted instead of an auto refresh operation, this allows the auto refresh operation to be suspended while the targeted refresh is carried out, and resumed when RHR signal is not active.

The MUX 346 accepts the targeted refresh addresses TXADD and the auto refresh addresses TXADD and outputs one of them as the pre-refresh address Pre_RXADD to the redundancy control circuit 348. The MUX 346 may receive the IREF and/or RHR signals to control the output of the MUX 346. In some embodiments, the MUX 346 may provide the targeted refresh address TXADD as Pre_RXADD when the RHR signal is in an active state and/or the IREF signal is in an inactive state. In some embodiments, the MUX 346 may provide the auto refresh address AXADD when the RHR signal is in an inactive state and/or the IREF signal is in an active state. In some embodiments, the MUX 346 may be configured to provide TXADD first responsive to an active RHR signal followed by TXADD when the RHR signal and/or IREF signal indicate a double pump refresh operation where a first pump is a targeted refresh operation.

Responsive to receiving the pre-refresh address Pre_RXADD, the redundancy control circuit may provide the pre-refresh address Pre_RXADD to a redundancy information circuit (not shown in FIG. 3), such as redundancy information circuit 140 and/or 240 and receive redundancy information Red_Info regarding the pre-refresh address Pre_RXADD. When pre-refresh address Pre-RXADD corresponds to a normal word line and Red_Info indicates the normal word line has not been remapped to a redundant word line (e.g., no match is found in the redundancy information circuit), the redundancy control circuit 348 may provide the pre-refresh address Pre-RXADD as refresh address RXADD to a row decoder (not shown in FIG. 3), such as row decoder 108 and/or 208. In some embodiments, the redundancy control circuit 348 may also provide an inactive refresh operation skip signal Skip associated with the refresh address RXADD to the row decoder. When the Red_Info indicates the normal word line is defective (e.g., a match is found), in some embodiments, the redundancy control circuit 348 may not provide the pre-refresh address Pre_RXADD as the refresh address RXADD. In some embodiments, not providing the refresh address RXADD may include masking the RXADD signal. Additionally or alternatively, the redundancy control circuit 348 may provide an active Skip signal, indicating the refresh operation of the word line associated with refresh address RXADD should not be performed.

When pre-refresh address Pre-RXADD corresponds to a redundant word line and Red_Info indicates the redundant word line is defective or not in use (e.g., no match is found in the redundancy information circuit), the redundancy control circuit 348 may not provide the pre-refresh address Pre_RXADD as the refresh address RXADD and/or provide an active Skip signal. When Red_Info indicates the redundant word line is in use (e.g., a match is found), the redundancy control circuit 348 may provide the pre-refresh address Pre_RXADD as the refresh address RXADD. In some embodiments, the redundancy control circuit 348 may also provide an inactive refresh operation skip signal Skip.

As described above, the Skip signal may be based, at least in part, on the Red_Info signal. In some embodiments, the Skip signal may correspond to the Red_Info signal. That is, the redundancy control circuit 348 may provide the refresh address RXADD and the associated redundancy information Red_Info as the Skip signal.

In some embodiments, the redundancy control circuit 348 may further receive the RHR and IREF signals. The redundancy control circuit 348 may retrieve the redundancy information and provide the refresh address RXADD and/or Skip signal responsive to the various states of the RHR and IREF signals. For example, in some embodiments, the redundancy control circuit 348 may retrieve redundancy information for both a targeted refresh address and auto refresh addresses responsive to an active RHR signal when the RHR signal is responsive to a first pump of a double pump refresh operation. In some embodiments, the redundancy control circuit 348 may stop retrieving redundancy information responsive to an active IREF signal when the IREF signal is responsive to a second pump of the double pump refresh operation. Responses of the redundancy control circuit 348 to the RHR and IREF signals are provided in reference to FIG. 4.

Alternatively, in some embodiments, MUX 346 may provide TXADD or AXADD as RXADD and the redundancy control circuit 348 may be included in the row decoder.

Figure 4:
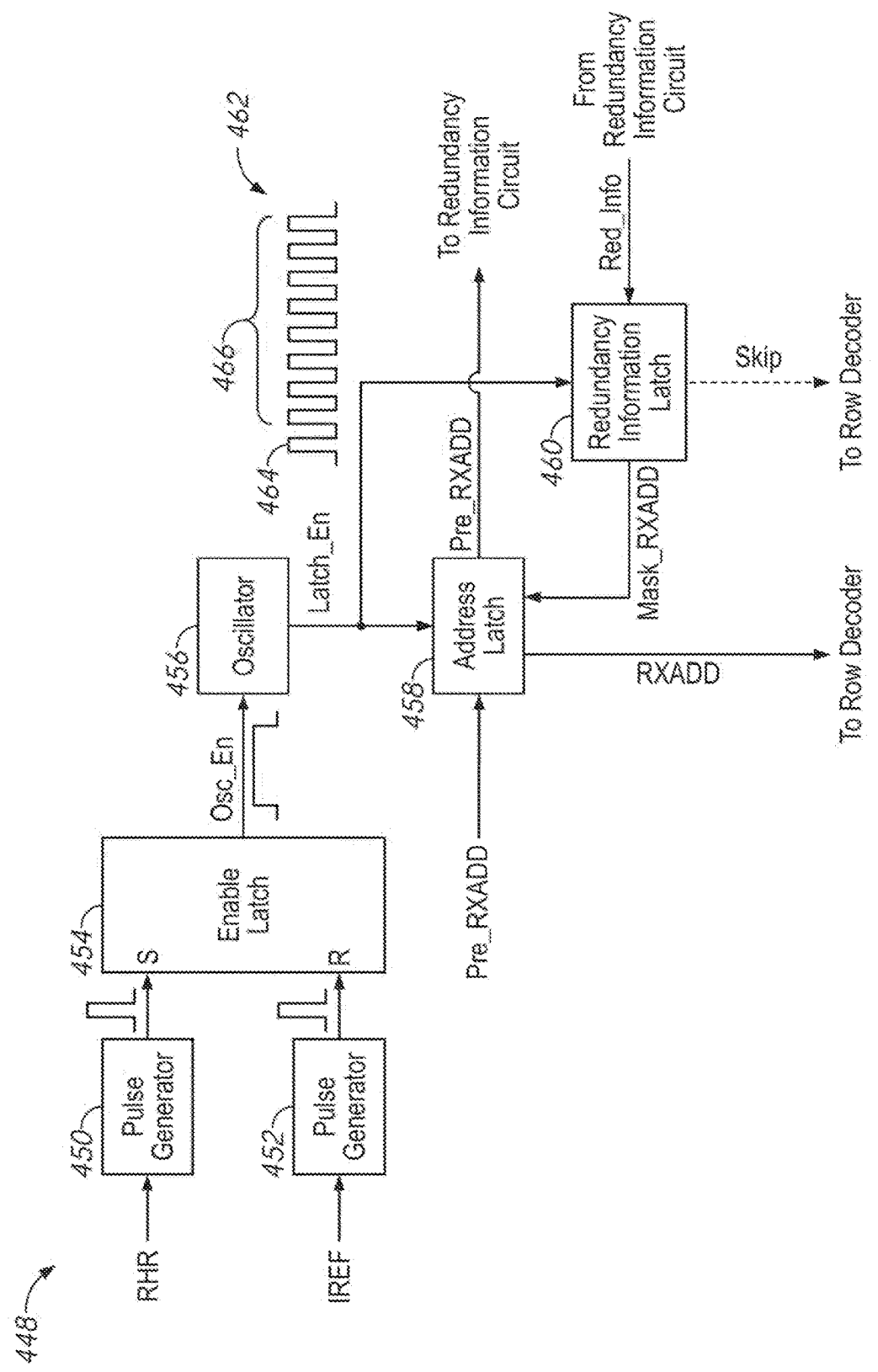
FIG. 4 is a block diagram of a redundancy control circuit according to an embodiment of the present disclosure.

FIG. 4 is a block diagram of a redundancy control circuit according to an embodiment of the present disclosure. In some embodiments, the redundancy control circuit 448 may be included in redundancy control circuit 348. In some embodiments, the redundancy control circuit 448 may be included in a refresh control circuit, such as refresh control circuit 116 and/or 216. In some embodiments, the redundancy control circuit 448 may be included in a row decoder such as row decoder 108 and/or 208. The redundancy control circuit 400 may include a pulse generator 450, pulse generator 452, enable latch 454, oscillator 456, address latch 458, and redundancy information latch 460.

The redundancy control circuit 448 may receive targeted refresh addresses and/or auto refresh addresses Pre_RXADD from a targeted refresh address generator (e.g., targeted refresh address generator 342) and an auto refresh address generator (e.g., AREF generator 344). In some embodiments, Pre_RXADD may be provided via a multiplexer (e.g., MUX 346). The Pre_RXADD addresses may be provided to address latch 458. In some embodiments, address latch 458 may include one or more registers or other suitable storage circuitry for storing one or more addresses. For example, for an auto refresh operation, multiple auto refresh addresses may be provided as Pre_RXADD. In some embodiments, when Pre_RXADD is associated with a truncated or compressed address corresponding to multiple word lines the redundancy control circuit 400 may also include a decoder (not shown) that may decode/decompress the address into the row addresses for individual word lines for storage in the address latch 458.

The address latch 458 may provide the address Pre_RXADD for the individual word lines to a redundancy information circuit (not shown in FIG. 4), such as redundancy information circuit 140 and/or 240. In some embodiments, the address information for the individual word lines may be provided serially (e.g., one at a time) to the redundancy information circuit.

The address latch 458 may provide the address Pre_RXADD for the individual word lines responsive to an active latch enable signal Latch_En. As shown in FIG. 4, the latch enable signal Latch_En may be a periodic signal 462 that oscillates between high and low logic states and/or voltage levels. In some embodiments, each time the periodic signal 462 transitions to an active state, the address latch 458 may provide another address Pre_RXADD associated with another individual word line. In some embodiments, each time the periodic signal 462 transitions to an active state, the address latch 458 may provide a refresh address RXADD associated with an individual word line for which redundancy information has been received to a row decoder (not shown), such as row decoder 108 and/or 208.

The redundancy information latch 460 may include one or more flip-flops, registers, and/or other suitable storage circuitry for storing redundancy information Red_Info associated with one or more word lines, such as the word lines associated with Pre_RXADD. The Red_Info may be received from the redundancy information circuit responsive to the Pre_RXADD being provided by the address latch 458. In some embodiments, Red_Info may be a single bit indicating whether or not a match was found for the word line in the redundancy information stored in the redundancy information circuit. The redundancy information latch 460 may further include logic for generating a refresh address masking signal Mask_RXADD and/or a refresh operation skip signal Skip based, at least in part, on the Red_Info. In some embodiments, the Mask_RXADD and/or Skip signal may correspond to the Red_Info.

In some embodiments, when the Red_Info indicates that the word line associated with RXADD provided by address latch 458 should not be refreshed (e.g., unused or defective), the redundancy information latch 460 may provide an active Mask_RXADD to the address latch 458, which may prevent the address latch 458 from providing RXADD. Additionally or alternatively, the redundancy information latch 460 may provide an active Skip signal to the row decoder to indicate a refresh operation of the word line should be skipped. When the Red_Info indicates that the word line associated with RXADD should be refreshed (e.g., non-defective normal word line or used redundant word line), the redundancy information latch 460 may provide an inactive Mask_RXADD signal and/or an inactive Skip signal to permit the RXADD to be provided to the row decoder and refreshed during the refresh operation.

Similar to the address latch 458, the redundancy information latch 460 may provide the Mask_RXADD and/or Skip signals responsive to activation of the Latch_En signal. Having both the address latch 458 and the redundancy information latch 460 provide signals responsive to the Latch_En signal may allow synchronization of the RXADD with the Mask_RXADD and/or Skip signals. That is, enabling address latch 458 and redundancy information latch 460 with the Latch_En signal may allow the appropriate redundancy information to be associated with the appropriate refresh address.

The latch enable signal Latch_En may be provided by an oscillator 456 in some embodiments. The oscillator 456 may be enabled by an oscillator enable signal Osc_En provided by an enable latch 454. In some embodiments, the enable latch 454 may be triggered by pulses received from pulse generators 450 and 452. The pulse generator 450 may receive a row hammer refresh signal RHR from a RHR state control circuit (e.g., RHR state control circuit 236). When the RHR signal transitions to an active state, the pulse generator 450 may issue a pulse. The pulse may be received by the enable latch 454 at a set input S, and in response, the enable latch 454 may provide an active Osc_En signal. The pulse generator 452 may receive an internal refresh signal IREF from the RHR state control circuit. When the IREF signal transitions to an active state, the pulse generator 452 may issue a pulse. The pulse may be received by the enable latch 454 at a reset input R, and in response, the enable latch 454 may transition the active Osc_En signal to an inactive state.

Alternatively, in some embodiments, the enable latch 454 may be configured to provide an active Osc_En signal responsive to an active RHR signal and an inactive Osc_En signal responsive to an inactive RHR signal. As will be described in more detail with reference to FIG. 8, the enable latch 454 may include additional logic and/or an additional logic circuit may be used to provide the Osc_En signal for a desired length of time for various multi pump refresh sequences.

The frequency of the oscillator 456 may be selected such that during a duration of the active Osc_En signal, the latch enable signal Latch_En transitions to an active state a number of times N equal to a number of targeted refresh addresses and auto refresh addresses associated with individual word lines to be refreshed in a double pump refresh operation. In the example shown, Latch_En may transition to an active state nine times for retrieving redundancy information for a word line associated with a targeted refresh address (e.g., activation 464) and eight word lines associated with auto refresh addresses (e.g., activations 466).

Figure 5:
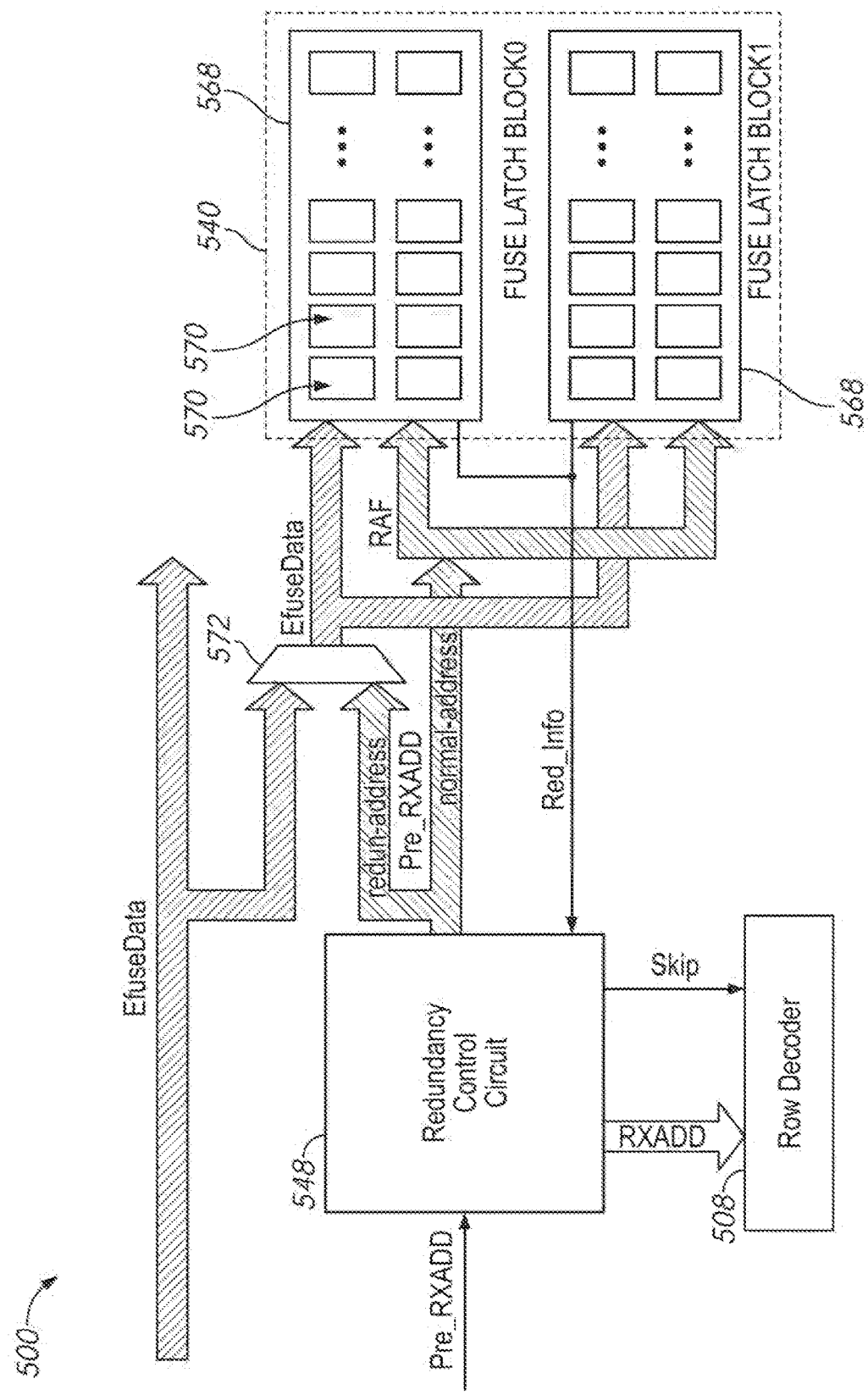
FIG. 5 is a block diagram of at least a portion of a semiconductor device according to an embodiment of the disclosure.

FIG. 5 is a block diagram of at least a portion of a semiconductor device according to an embodiment of the disclosure. The semiconductor device 500 may be included in semiconductor device 100 in some embodiments. The semiconductor device 500 may include a redundancy control circuit 548, a row decoder 508, and a redundancy information circuit 540. In some embodiments, redundancy control circuit 548 may include redundancy control circuit 348 and/or 448. In some embodiments, row decoder 508 may be included in row decoder 108 and/or 208. In some embodiments, redundancy information circuit 540 may be included in redundancy information circuit 140 and/or 240.

The redundancy information circuit 540 may include one or more fuse latch blocks 568. Each fuse latch block 568 may include one or more fuse latches 570. The fuse latches 570 may be used to store redundancy information. For example, fuses latches may be programmed to indicate which normal word lines have been remapped to redundant word lines referred to as row address fuse data (RAF), and/or which redundant word lines are being used to replace defective normal word lines and/or other defective redundant word lines referred to as electrical fuse data (EfuseData). In some embodiments, the fuse latches 570 may be programmed by a post package repair (PPR) module of the semiconductor memory device (not shown). Although referred to as fuses, in some embodiments, the fuse latches 570 may include anti-fuses and/or other forms of non-volatile storage.

The redundancy control circuit 548 may provide a row address Pre_RXADD corresponding to a word line to the redundancy information circuit 540. Redundancy information for Pre_RXADD may be analyzed as a redundant word line address, a normal word line, or both. Redundancy information Red_Info related to the RAF data or EfuseData for Pre_RXADD may be provided by the redundancy information circuit 540 to the redundancy control circuit 548. Red_Info may indicate whether a match was found in the EfuseData and/or RAF data for the word line associated with Pre_RXADD. In some embodiments, Red_Info may be a single bit that takes a first logic state (e.g., high, '1') if a match is found and a second logic state (e.g., low '0') of a match is not found in the RAF data or Efuse data. In some embodiments, the Red_Info may include a second bit indicating whether match information is for the RAF data or the EfuseData.

As noted in reference to FIG. 1, other components of the semiconductor device 100 may access the redundancy information circuit 540. In some embodiments, one or more multiplexers may be used to control access to the redundancy information circuit 540. For example, multiplexer 572 may be included determine whether the redundancy control circuit 548 or another component (not shown) may request match information for the EfuseData from the redundancy information circuit 540. The multiplexer 572 may be controlled by one or more control signals (not shown), for example, by internal signals generated based on commands received by the semiconductor device 500 (e.g., PPR command, ACT command, REF command).

Based at least in part on the Red_Info provided by the redundancy information circuit 540, the redundancy control circuit 548 may provide a refresh address (e.g., a targeted refresh address, an auto refresh address) and/or a skip refresh operation signal Skip to the row decoder 508. The row decoder 508 may cause word lines to be refreshed that are associated with RXADD that are in use (e.g., non-defective normal word line, non-defective in-use redundant word line).

Figure 6:
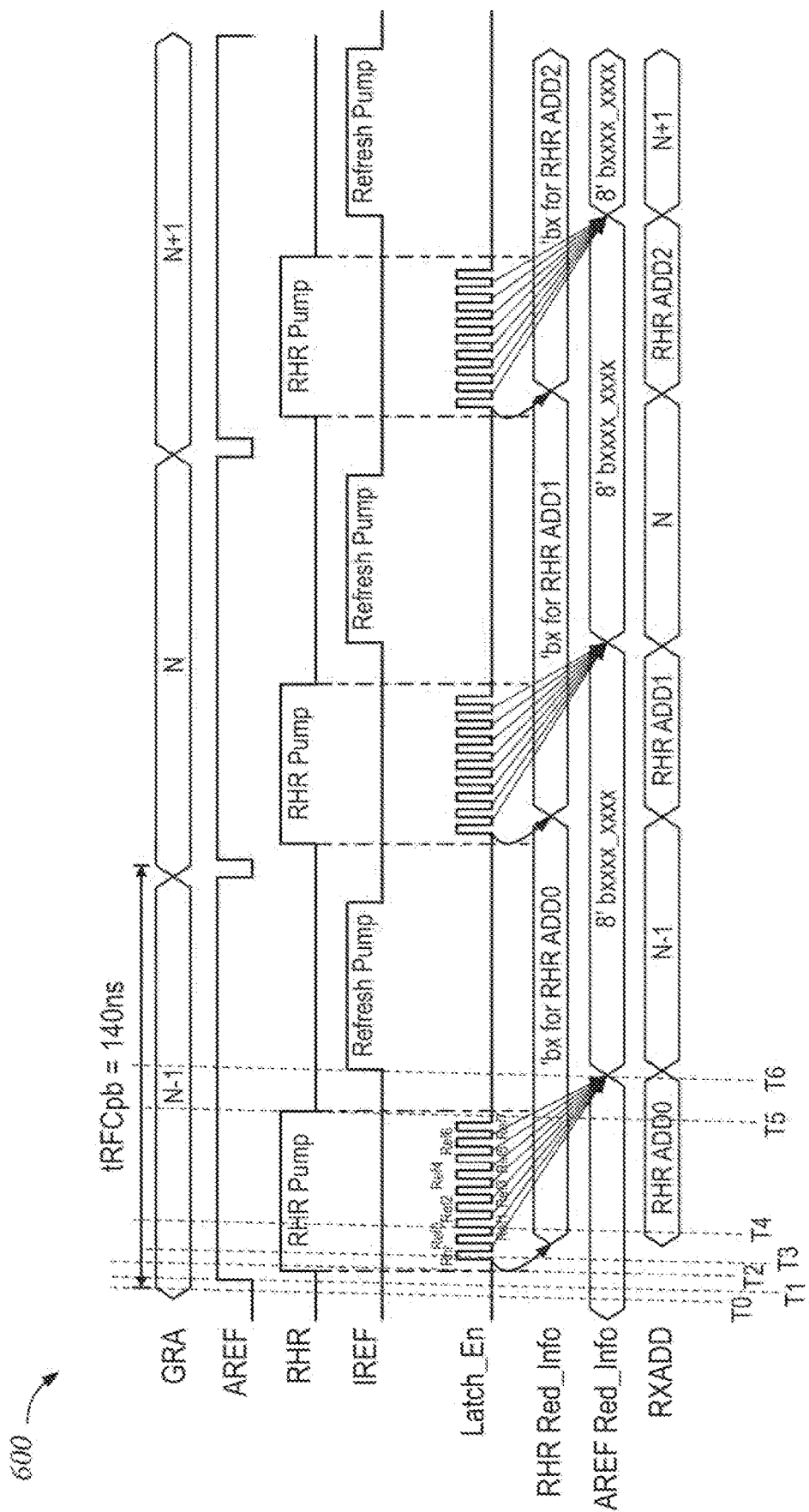
FIG. 6 is a timing diagram illustrating operations of a semiconductor device according to an embodiment of the disclosure.

FIG. 6 is a timing diagram illustrating operations of a semiconductor device according to an embodiment of the disclosure. The timing diagram 600 may illustrate the states of various signals of a semiconductor device, such as semiconductor device 100 and/or 500 during one or more memory operations. While timing diagram 600 will be described with reference to FIGS. 1-5, the signals and operations of timing diagram 600 are not limited to these devices.

The first line of timing diagram 600 indicates the data on a global row address bus (GRA). The global row address bus may be an address bus that provides row addresses to all of the banks of a memory array, such as BANK0-7 of memory array 118. The second line of timing diagram 600 indicates the state of a refresh signal AREF responsive to a refresh command. In some embodiments, the refresh command may be provided by a memory controller. In some embodiments, the refresh command may be generated internally by a command decoder, such as command decoder 106. The third and fourth lines of timing diagram 600 indicate the state of first and second pumps of a double pump refresh operation. In the example shown, the first pump may be associated with activation of a row hammer refresh signal RHR and the second pump may be associated with activation of an internal refresh signal IREF as shown in FIGS. 2-4.

The fifth line of the timing diagram 600 indicates the status of a latch enable signal Latch_En, which may be used to control timing of accessing redundancy information for word lines associated with targeted refresh and/or auto refresh addresses, as discussed with reference to FIG. 4.

The sixth and seventh lines indicate the availability of the redundancy information for targeted refresh addresses (RHR Red_Info) and auto refresh addresses (AREF Red_Info). Although shown as provided as a single bit line Red_Info in FIGS. 2-4, in some embodiments, the redundancy information for the targeted refresh addresses and auto refresh addresses may be stored separately and/or provided on separate data lines. The final line of timing diagram 600 indicates the row address provided as the refresh address RXADD for performing a refresh operation.

At or around time T0, a row address N−1 may be provided on the global row address bus. In some embodiments, the row address N−1 may correspond to multiple word lines. In the example shown, row address N−1 corresponds to eight word lines. However, in other examples, row address N−1 may correspond to more or fewer word lines.

At or around time T1, a refresh command may be provided, indicated by activation of the refresh command signal. In the example shown, the refresh command may indicate a double pump refresh operation. In some embodiments, the refresh command may indicate that the first pump corresponds to a targeted refresh operation and the second pump corresponds to an auto refresh operation. In some embodiments, the semiconductor device may be programmed such that all double pump refresh operations perform those particular refresh operations in that order. In some embodiments, the semiconductor device may be programmed such that every certain number of double pump refresh operations are performed in a particular manner.

Responsive, at least in part, to the refresh command, at or around time T2, the first pump signal may be activated. As noted, this may further correspond to activation of the RHR signal. Responsive, at least in part, to the activation of first pump signal, the Latch_En signal may begin oscillating at or around time T3. The oscillating Latch_En signal may enable retrieval of the redundancy information for a targeted refresh address and the auto refresh addresses (based on the global row address N−1), for example, by redundancy control circuit 348, 448, and/or 548 from redundancy information circuit 140, 240 and/or 540. In the example shown, the targeted refresh address corresponds to one word line.

At or around time T4, the redundancy information RHR Red_Info may be available and the targeted refresh address RHR ADDO (e.g., TXADD) may be provided as RXADD. The redundancy information and targeted refresh address may be provided in sufficient time for a targeted refresh operation to occur during the time period allocated for the double pump refresh operation. Of course, as described herein, the refresh operation may be skipped if RHR Red_Info indicates the word line is defective and/or unused.

At or around time T5, the first pump signal may transition to an inactive state, and the Latch_En signal may stop oscillating, which may disable access of the redundancy information. However, Latch_En may have enabled access for a sufficient period of time such that the redundancy information for all of the auto refresh addresses may be retrieved. Thus, when the second pump signal transitions to an active state at or around time T6, the redundancy information AREF Red_Info is available and the refresh addresses (e.g., AXADD) corresponding to N-1 may be provided as RXADD. Accordingly, the auto refresh operation may occur in a timely manner for the double pump refresh operation. However, refreshing of some or all of the word lines may be skipped during the auto refresh operation if AREF Red_Info indicates one or more of the word lines were defective and/or not in use.

Alternatively, in some embodiments, such as the one shown in FIG. 4, the Latch_En signal may stop oscillating responsive to the second refresh pump at or around time T6.

Additional double pump refresh operations are shown in timing diagram 600 corresponding to additional global row addresses and refresh commands provided. These double pump refresh operations may occur in substantially the same manner as described for the first double pump refresh operation of timing diagram 600.

Figure 7:
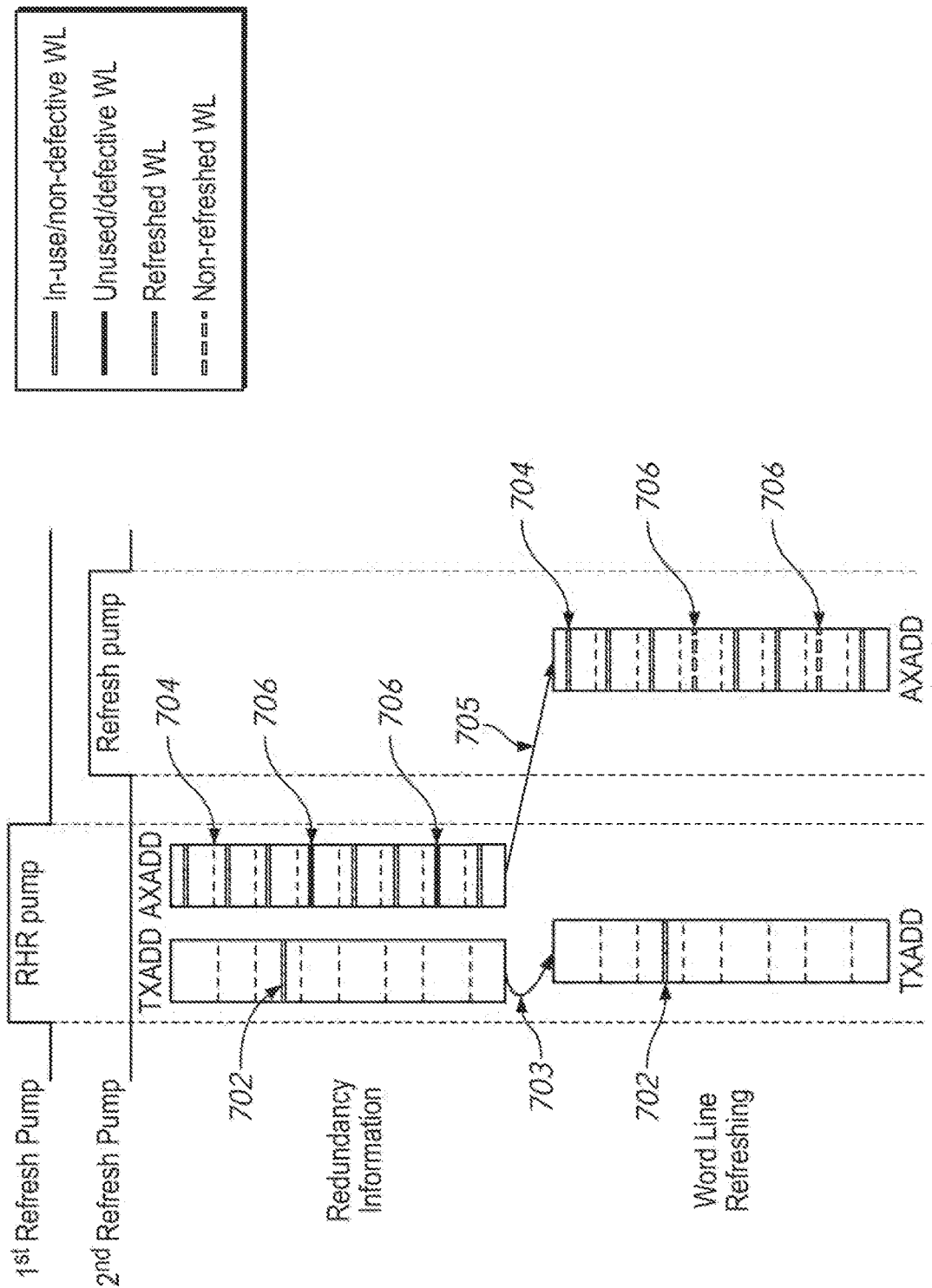
FIG. 7 illustrates an example of retrieving redundancy information and activation of word lines according to an embodiment of the present disclosure.

FIG. 7 illustrates an example of retrieving redundancy information and activation of word lines according to an embodiment of the present disclosure. During a first pump of a double refresh operation for which a targeted refresh operation is performed, the redundancy information for the word line 702 associated with the targeted refresh address TXADD and the word lines 704 associated with the auto refresh addresses AXADD is retrieved. In the example shown, the word line 702 associated with TXADD is found to be in use/not defective. Accordingly, shortly thereafter, the word line 702 is refreshed as indicated by arrow 703 during the targeted refresh operation. Continuing the example, two of the word lines 706 associated with the auto refresh addresses AXADD are found to be defective and/or not in use. Accordingly, during the second pump of the double refresh operation, when an auto refresh operation is performed, the two word lines 706 found to be defective are not refreshed. In some applications, skipping refresh operations on defective and/or unused word lines may reduce risk of damage to a semiconductor device and/or reduce power consumption by the semiconductor device.

Figure 8:
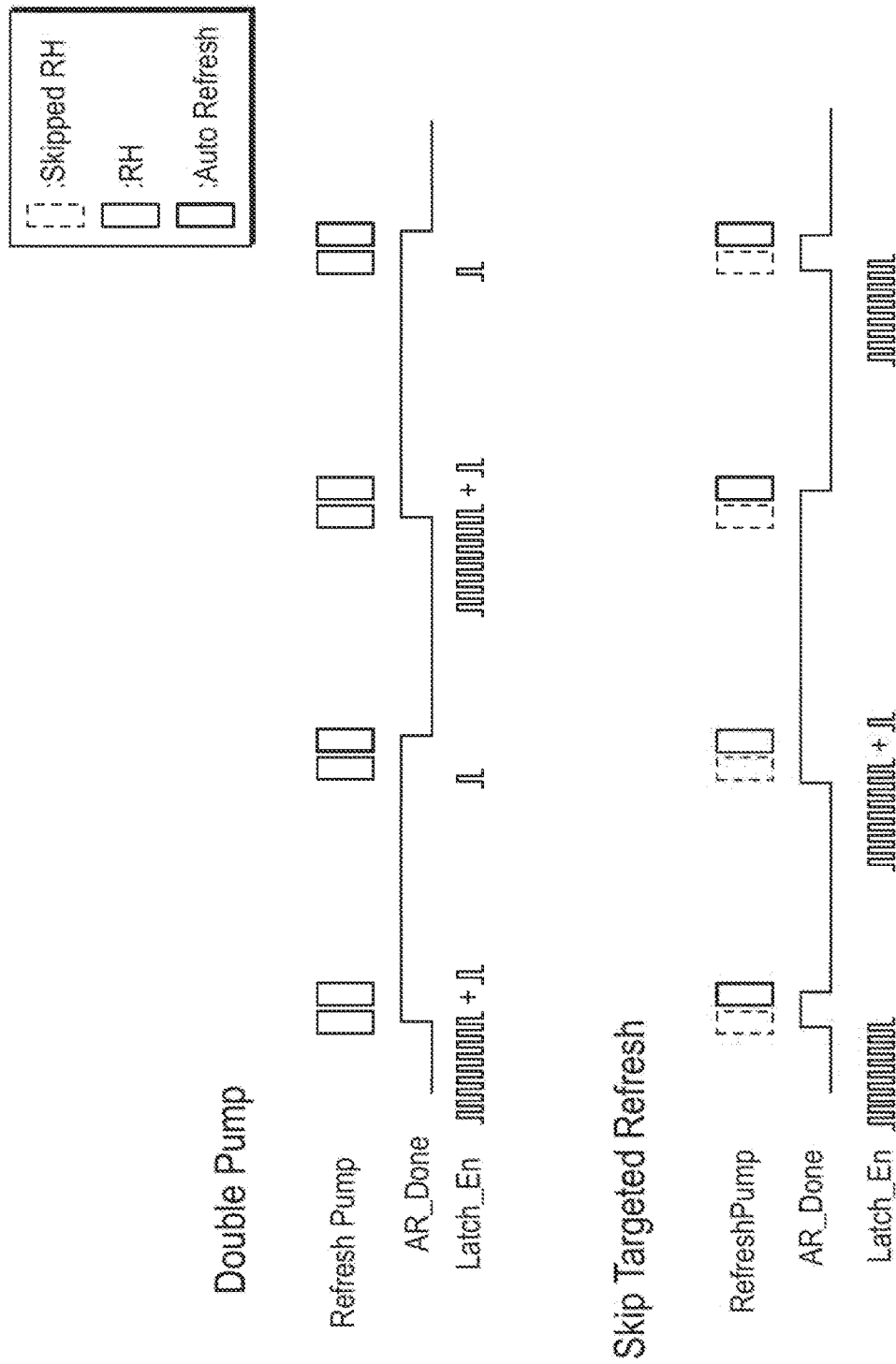
FIG. 8 illustrates status of enable signals for various double pump refresh sequences according to embodiments of the present disclosure.

FIG. 8 illustrates status of enable signals for various double pump refresh sequences according to embodiments of the present disclosure. The examples described herein, such as those described with reference to FIGS. 6 and 7, illustrate operations when a sequence of double pump refresh operations are all assigned as a first pump for a targeted refresh operation and a second pump for an auto refresh operation. However, the pumps of the double pump refresh operation may be allocated differently, and sequences of double pump refresh operations may have different allocations from one another. For example, some semiconductor devices permit initiation of one or more targeted refresh operations by an external command. These external commands may be referred to as refresh management (RFM) commands. In some applications, responsive to an RFM command, both pumps of a double pump refresh operation may be allocated to targeted refresh operations. In some applications, responsive to an RFM command, double pump refresh operations dedicated to targeted refresh operations may be alternated with double pump refresh operations where a first pump is associated with a targeted refresh operation and a second pump is associated with the auto refresh operation. This pattern of double pump refresh operations is shown in the top line as Refresh Pump of the "Double Pump" portion of FIG. 8.

As discussed with reference to FIG. 3, generation of auto refresh addresses may be suspended during targeted refresh operations. Accordingly, redundancy information need only be retrieved for the auto refresh addresses of the next auto refresh operation during one of the targeted refresh operations. During the other targeted refresh operations, only redundancy information for the targeted refresh operation needs to be retrieved by the redundancy control circuit (e.g., redundancy control circuit 448). The number of oscillations of the latch enable signal Latch_En for each double pump operation is shown in the third line of the "Double Pump" portion of FIG. 8. However, the oscillator generating the latch enable signal Latch_En (e.g., oscillator 456) may be enabled for a longer period of time than necessary by an oscillator enable signal Osc_En (see FIG. 4) when enabled by an enable latch based on receiving row hammer refresh RHR and internal refresh 1REF signals, such as enable latch 454.

To save energy consumed by retrieving the redundancy information for the same auto refresh addresses multiple times, in some embodiments, the enable latch providing Osc_En may be modified to include additional logic to adjust the Osc_En signal when an RFM command is received. In some embodiments, an address latch storing the auto refresh addresses, such as address latch 458 may include additional logic that detects that the redundancy information for the addresses stored in the address latch has already been requested and ignores the latch enable signal Latch_En when so detected. In another example, additional logic may be provided that detects when an auto refresh operation has been completed and provides an active auto refresh completed signal AR_Done as shown in the second line of the "Double Pump" in FIG. 8. The AR_Done signal may be used to modify (e.g., override) the oscillator enable signal Osc_En such that Latch_En signal is activated for a number of oscillations to retrieve redundancy for the targeted refresh addresses when multiple targeted refresh operations occur in a row.

In some semiconductor devices, some targeted refresh operations may be skipped as shown in the first line Refresh Pump of the "Skip Targeted Refresh" portion of FIG. 8. The skipped targeted refresh operations may be included in double pump operations where both pumps are dedicated to targeted refresh operations or in double pump operations where the first pump is a targeted refresh operation and the second pump is an auto refresh operation. As shown by the third line in the "Skip Targeted Refresh" portion of FIG. 8, the latch enable signal Latch_En is needed to retrieve the redundancy information for the auto refresh addresses prior to the auto refresh operation, even if the targeted refresh operation is skipped. However, the oscillator enable signal Osc_En may not enable the latch signal Latch_En because an RHR signal may not be activated when the targeted refresh operation is skipped.

In some embodiments, to avoid skipping retrieval of the redundancy information for the auto refresh addresses when a targeted refresh operation is skipped, the enable latch may be modified to include logic and/or an additional enable circuit may be provided to the oscillator that receives the refresh signal AREF such that all pumps of a refresh operation are accounted for and retrieval of the auto refresh address redundancy information can be timely completed. In some embodiments, as indicated by the second line of the "Skip Targeted Refresh" portion of FIG. 8, similar to the "Double Pump Portion" the AR_Done signal provided based on detection of the auto refresh operations may be used to ensure Latch_En is enabled to retrieve the redundancy information for the auto refresh addresses when a targeted refresh operation is skipped.

As should be apparent from FIG. 8, the features of retrieving redundancy information for auto refresh addresses during a time period for a targeted refresh operation is not limited to double pump refresh operations, but may be applicable to any number of pumps of a multi pump refresh operation so long as there is at least one targeted refresh operation performed before each auto refresh operation of the multi pump refresh operation.

Figure 9:
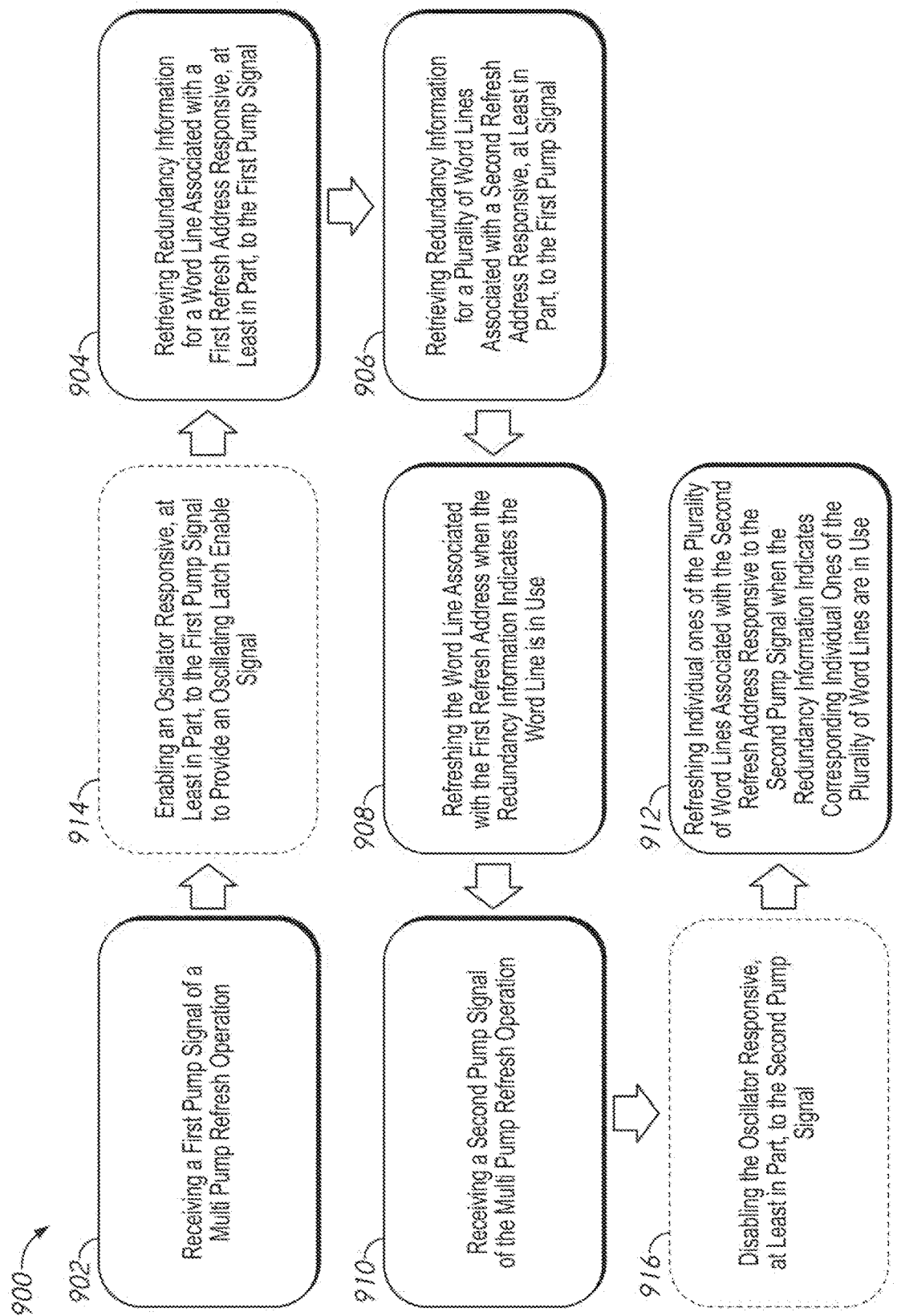
FIG. 9 is a flow chart of a method according to an embodiment of the present disclosure.

FIG. 9 is a flow chart of a method according to an embodiment of the present disclosure. In some embodiments, the method 900 may be performed by a semiconductor device, such as semiconductor device 100 and/or 500. In some embodiments, the method 900 may be performed, at least in part, by a refresh control circuit, such as refresh control circuit 116 and/or 206 and/or a row decoder circuit 108, 208, and/or 508.

At block 902, "receiving a first pump signal of a multi pump refresh operation" may be performed. In some embodiments, the first pump signal may be received by a refresh address generator, such as refresh address generator 234 and/or 334. In some embodiments, the first pump signal may correspond to a targeted refresh operation.

At block 904, "retrieving redundancy information for a word line associated with a first refresh address responsive, at least in part, to the first pump signal" may be performed. At block 906, "retrieving redundancy information for a plurality of word lines associated with a second refresh address responsive, at least in part, to the first pump signal" may be performed." In some embodiments, the redundancy information may be retrieved by the refresh address generator from a redundancy information circuit, such as redundancy information circuit 104, 204 and/or 504. In some embodiments, the redundancy information may be retrieved by a redundancy control circuit, such as redundancy control circuit 348, 448, and/or 548, which may be located with a refresh control circuit or a row decoder circuit. In some embodiments, the first refresh address may be a targeted refresh address and the second refresh address may be an auto refresh address.

At block 908, "refreshing the word line associated with the first refresh address when the redundancy information indicates the word line is in use" may be performed. In some embodiments, at least some of the redundancy information for the plurality of word lines associated with the second refresh address may be retrieved during refreshing the word line associated with the first refresh address. That is, in some embodiments, at least portions of block 906 and block 908 may be performed at the same time.

At block 910, "receiving a second pump signal of the multi pump refresh operation" may be performed. In some embodiments, the second pump signal may correspond to an auto refresh operation. At block 912, "refreshing individual ones of the plurality of word lines associated with the second refresh address responsive to the second pump signal when the redundancy information indicates corresponding individual ones of the plurality of word lines are in use" may be performed.

In some embodiments, method 900 may include block 914 where "enabling an oscillator responsive, at least in part, to the first pump signal to provide an oscillating latch enable signal" may be performed. In some embodiments, retrieving the redundancy information for the word line associated with the first refresh address and the redundancy information for the plurality of word lines associated with the second refresh address are performed responsive, at least in part, to the oscillating latch enable signal. In some embodiments, method 900 may further include block 916 where "disabling the oscillator responsive, at least in part, to the second pump signal" may be performed. Although shown prior to block 912, in some embodiments, block 916 may be performed after or simultaneously with block 912.

As disclosed herein, multi pump refresh operation may be performed where a refresh operation responsive to a pump may be a targeted refresh operation and a subsequent refresh operation responsive to a subsequent pump may be an auto refresh operation. In some applications, performing the targeted refresh operation prior to the auto refresh operation during a multi pump refresh operation may allow adequate time for checking the redundancy information for all row addresses such that delaying of refresh operations may be reduced or eliminated. Checking the redundancy information for some or all of the refreshed word lines may allow for skipping refresh operations on some or all defective and/or unused word lines. In some applications, skipping refresh operations on defective word lines may reduce the risk of damage to nearby word lines and/or other components of the memory device. In some applications, skipping refresh operations on unused word lines may reduce power consumption by the memory device.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
    an address latch configured to store a first refresh address and a second refresh address, request redundancy information for word lines corresponding to the first refresh address and the second refresh address, and provide a third refresh address, wherein the third refresh address corresponds to at least one of the first refresh address or the second refresh address; and
    a redundancy information latch configured to receive redundancy information for the word lines corresponding to the first refresh address and the second refresh address and provide at least one of a mask signal or a refresh operation skip signal based, at least in part, on the redundancy information, wherein the mask signal masks the third refresh address and the skip signal causes the refresh operation to be skipped when the redundancy information indicates a word line associated with the third refresh address is defective or not in use.

2. The apparatus of claim 1, further comprising an oscillator configured to provide a latch enable signal to the address latch and the redundancy information latch, Wherein the latch enable signal is configured, at least in part, to synchronize operations of the address latch and the redundancy information latch.

3. The apparatus of claim 2, further comprising an enable latch configured to provide an oscillator enable signal to the oscillator, wherein the enable latch is configured to transition the oscillator enable signal to an active state responsive to an activation of a first pulse signal and transition the oscillator enable signal to an in inactive state responsive to an activation of a second pulse signal.

4. The apparatus of claim 3, further comprising:
a first pulse generator configured to activate the first pulse signal responsive to activation of a first refresh operation signal; and
a second pulse generator configured to activate the second pulse signal responsive to activation of a second refresh operation signal.

5. The apparatus of claim 2, wherein the latch enable signal is configured to enable the address latch and the redundancy information latch a number of times corresponding to a number of word lines associated with the first refresh address and the second refresh address.

6. The apparatus of claim 1, wherein the first refresh address corresponds to a word line and the second refresh address corresponds to a plurality of word lines.

7. The apparatus of claim 1, further comprising a redundancy information circuit configured to store and provide redundancy information relating to ones of a plurality of normal word lines which are remapped to corresponding ones of a plurality of redundant word lines.

8. An apparatus comprising:
a refresh control circuit configured to cause a first refresh operation and a second refresh operation, wherein the first refresh operation is performed responsive to a pump signal of a multi pump refresh operation and the second refresh operation is performed responsive to a subsequent pump signal of the multi pump refresh operation; and
a redundancy control circuit configured to retrieve redundancy information for word lines corresponding to a first refresh address for the first refresh operation and a second refresh address for the second refresh operation, wherein at least a portion of the redundancy information for the second refresh address is retrieved during the first refresh operation.

9. The apparatus of claim 8, further comprising a redundancy information circuit configured to store and provide the redundancy information relating to ones of a plurality of normal word lines which are remapped to corresponding ones of a plurality of redundant word lines.

10. The apparatus of claim 8, wherein the first refresh operation is a targeted refresh operation and the second refresh operation is an auto refresh operation and the first refresh address corresponds to a targeted refresh address and the second refresh address corresponds to an auto refresh address.

11. The apparatus of claim 10, wherein the redundancy control circuit is configured to retrieve redundancy information for a word line corresponding to a third refresh address for a third refresh operation and store the redundancy information for the word lines corresponding to the auto refresh address retrieved during the targeted refresh operation when the third refresh operation is a second targeted refresh operation and occurs before the second refresh operation.

12. The apparatus of claim 8, wherein the redundancy control circuit is further configured to cause the first refresh operation of a word line corresponding to the first refresh address to be skipped when the redundancy information indicates the word fine is defective or not in use.

13. The apparatus of claim 8, wherein the redundancy control circuit is further configured to cause the second refresh operation of a word line corresponding to the second refresh address to be skipped when the redundancy information indicates the word line is defective or not in use.

14. A method comprising:
receiving a first pump signal of a multi pump refresh operation;
retrieving redundancy information for a word line associated with a first refresh address responsive, at least in part, to the first pump signal;
retrieving redundancy information for a plurality of word lines associated with a second refresh address responsive, at least in part, to the first pump signal;
skipping refreshing the word line associated with the first refresh address when the redundancy information indicates the word line is not in use;
receiving a second pump signal of the multi pump refresh operation; and
skipping refreshing individual ones of the plurality of word lines associated with the second refresh address responsive to the second pump signal when the redundancy information indicates corresponding individual ones of the plurality of word lines are not in use.

15. The method of claim 14, wherein at least some of the redundancy information for the plurality of word lines associated with the second refresh address is retrieved during refreshing the word line associated with the first refresh address.

16. The method of claim 14, further comprising enabling an oscillator responsive, at least in part, to the first pump signal to provide an oscillating latch enable signal.

17. The method of claim 16, wherein the retrieving the redundancy information for the word line associated with the first refresh address and the redundancy information for the plurality of word lines associated with the second refresh address are performed responsive, at least in part, to the oscillating latch enable signal.

18. The method of claim 16, further comprising disabling the oscillator responsive, at least in part, to the second pump signal.

19. The method of claim 14, wherein the redundancy information is received by a redundancy control circuit of a refresh control circuit or a row decoder.

20. The method of claim 14, wherein the first refresh address corresponds to a targeted refresh address and the second refresh address corresponds to a targeted refresh address.

* * * * *